US007184558B2

(12) United States Patent
Yamamoto et al.

(10) Patent No.: US 7,184,558 B2
(45) Date of Patent: Feb. 27, 2007

(54) VOLUME CONTROLLER

(75) Inventors: Hideo Yamamoto, Saitama (JP); Yoshifumi Fujino, Saitama (JP)

(73) Assignee: Pioneer Corporation, Tokyo (JP)

( * ) Notice: Subject to any disclaimer, the term of this patent is extended or adjusted under 35 U.S.C. 154(b) by 0 days.

(21) Appl. No.: 09/986,695

(22) Filed: Nov. 9, 2001

(65) Prior Publication Data

US 2002/0076065 A1 Jun. 20, 2002

(30) Foreign Application Priority Data

Nov. 9, 2000 (JP) ............................ 2000-342008

(51) Int. Cl.
*H03G 1/00* (2006.01)

(52) U.S. Cl. ........................................ 381/86; 381/107

(58) Field of Classification Search ................ 381/104, 381/109, 86, 119, 107, 59, 56
See application file for complete search history.

(56) References Cited

U.S. PATENT DOCUMENTS 3,702,901 A * 11/1972 Cherry ........................ 381/19
5,046,106 A * 9/1991 Liebel et al. ............... 381/102
5,177,801 A * 1/1993 Shoda et al. ................ 381/104
5,263,188 A * 11/1993 Sanders et al. ............. 381/101
5,271,063 A * 12/1993 d'Alayer de Costemore d'Arc ......................... 381/104
5,491,755 A * 2/1996 Vogt et al. ..................... 381/86
5,511,129 A * 4/1996 Craven et al. .............. 381/103
5,745,583 A * 4/1998 Koizumi et al. .............. 381/86
5,983,087 A * 11/1999 Milne et al. ................ 455/149
6,721,428 B1 * 4/2004 Allred et al. ............... 381/103

* cited by examiner

*Primary Examiner*—Daniel Swerdlow
(74) *Attorney, Agent, or Firm*—Sughrue Mion, PLLC

(57) ABSTRACT

A volume controller for controlling volume balance between a front speaker and a rear speaker located within a vehicle, includes a fade volume computing unit for computing an amplifying factor k1 of an input signal for providing an increased volume at the rear or front speaker by the volume at a prescribed position within the vehicle which is equal to an decreased volume in the front or rear speaker when a signal supplied to the front or rear speaker is attenuated by an attenuating factor K1; and a control unit for multiplying the signal supplied to the rear or front speaker by k1 when a signal supplied to the front or rear speaker is attenuated by K1. In this configuration, a volume controller can form an acoustic field with a sense of realism when volume adjustment is preformed in a to-and-fro direction.

18 Claims, 2 Drawing Sheets

VOLUME CONTROLLER

BACKGROUND OF THE INVENTION

1. Field of the Invention

This invention relates to a volume controller for balancing the sound volume between a front speaker which is located at the front of a vehicle and a rear speaker which is located at the rear of the vehicle.

2. Description of the Related Art

Traditionally, an audio device has been widely used which is provided with four speakers on the left and right sides at the front and the rear within a vehicle, respectively in order to cause a driver/passenger to hear the signal reproduced from a broadcast, CD, DVD, etc.

Such an in-vehicle audio device can regulate the volume balance in a to-and-fro direction. In this case, as shown in FIG. 3, where a balancing point is moved from the center to the front side by an fade input from a fader inputting unit the volume from the front speaker does not vary whereas the volume from the rear speaker decreases with the fade input. If the balancing point is moved from the center toward the rear side, the volume from the rear speaker does not vary whereas the volume from the front speaker decreases with the fader input.

The volume balancing regulation having such a characteristic has the following disadvantage. Where a passenger who sits on the rear seat of a one-box car enjoys, a movie using a DVD player, which is now prevailing, using a rear speaker as a main speaker, he or she balances the volume from a center position to the rear side. However, actually, the volume decreases only at the front. It lacks the spreading toward the front at the listening point, and the volume within an entire room varies (decreases). This makes it difficult to form a sound field with a sense of realism.

SUMMARY OF THE INVENTION

An object of this invention is to provide a volume controller capable of regulating the balance in a volume level between a front side and a rear side without decreasing the volume of an entire passenger room.

In order to attain the above object, in accordance with this invention, there is provided a volume controller for controlling volume balance between a front speaker and a rear speaker located within a vehicle, comprising:

a fade volume computing unit for computing an amplifying factor k1 of an input signal for providing an increased volume at the rear or front speaker by the volume at a prescribed position within the vehicle which is equal to an decreased volume in the front or rear speaker when a signal supplied to the front or rear speaker is attenuated by an attenuating factor K1; and a control unit for multiplying the signal supplied to the rear or front speaker by k1 when a signal supplied to the front or rear speaker is attenuated by K1.

In the volume controller, preferably, the prescribed position is located at a center of a front seat, at a center of a rear seat, or a center between the front seat and the rear seat.

In the volume controller, preferably, attenuations when acoustic waves from the front speaker and rear speaker are propagated to the prescribed position are previously recorded, and on the basis of the attenuations, the increased and decreased volumes at the front or rear speaker are computed.

In the volume controller, preferably, the attenuations are computed on the basis of an input indicative of a relationship between the prescribed position and positions where the front and rear speaker are located.

In the volume controller, preferably, the increased volumes of the front or rear speaker and of the rear or front speaker are computed on an adjustment value in a level adjusting means to be connected to the front speaker and the rear speaker.

In accordance with this invention, where the volume balance between the front and the rear speakers is adjusted, when the volume at the front or rear speaker decreases, the volume at the rear or front speaker is increased so that the volume at a prescribed position in a passenger room is equal to that before the balance is adjusted. For this reason, after the volume balance between the front and rear speaker has been carried out, the sound field with a sense of realism can be formed.

The above and other objects and features of the invention will be more apparent from the following description taken in conjunction with the accompanying drawings.

DESCRIPTION OF THE PREFERRED EMBODIMENTS

Now referring to FIG. 1, an explanation will be given of an embodiment of a volume controller according to this invention.

Figure 1:
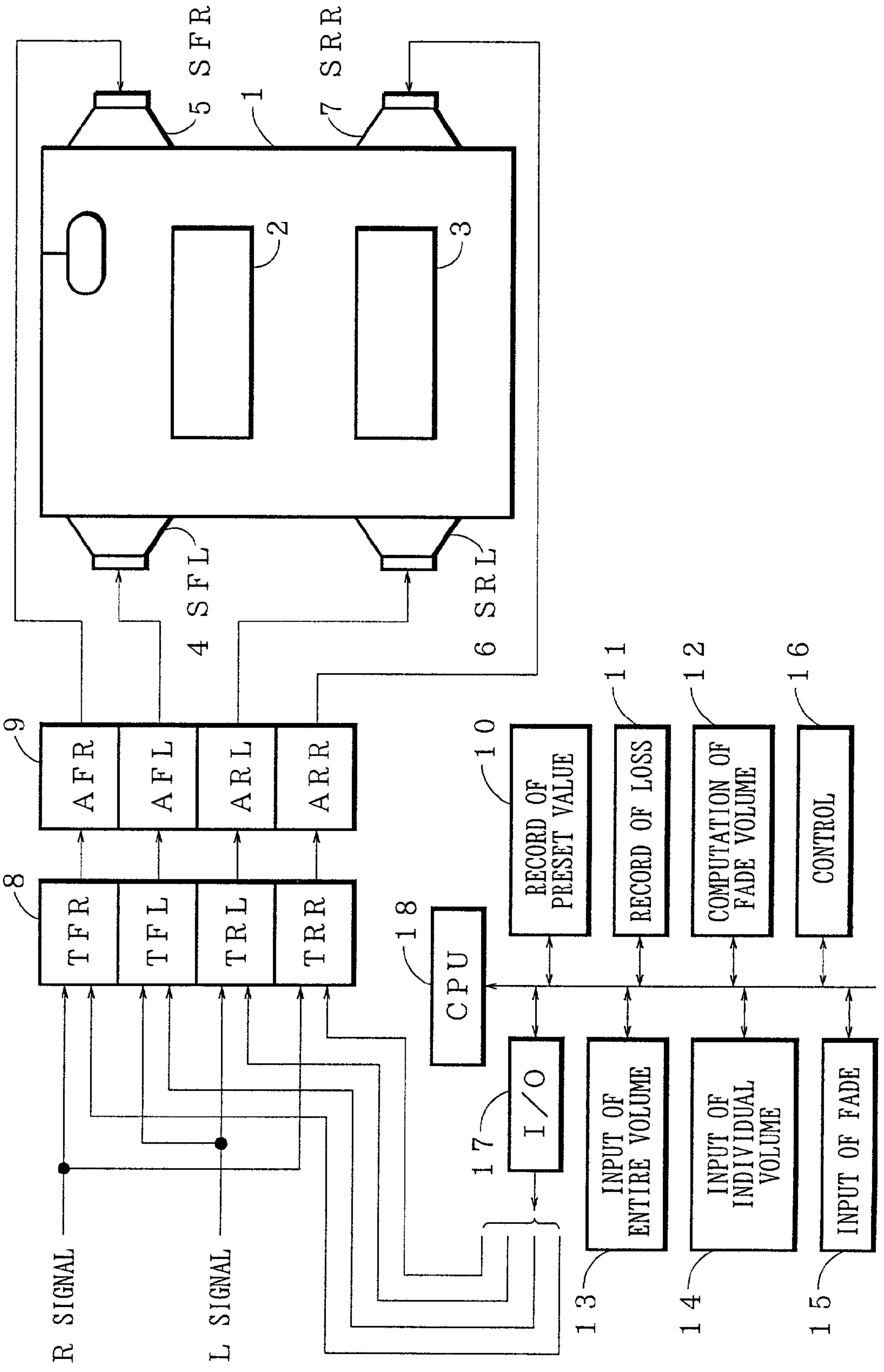
FIG. 1 is an arrangement view of the volume controller according to an embodiment of this invention.

FIG. 1 is an arrangement view of an embodiment of a volume controller according to this invention.

As seen from FIG. 1, a front seat 2 and a rear seat 3 are located at the front and at the rear thereof within a vehicle 1, respectively.

On the front left side and front right side of the vehicle 1, a front left side speaker (SFL)4 and a front right side speaker (SFR)5 are arranged, and on the rear left side and the rear right side of the vehicle 1, a rear left speaker (SRL)6 and a rear right speaker (SRR)7 are arranged.

Attenuators 8TFL, 8TFR, 8TRL and 8TRR are provided so as to correspond to the (SFL)4, (SFR)5, (SRL)6 and (SRR)7, respectively. An R signal to be reproduced is supplied to the attenuators 8TFR and 8TRR, and an L signal to be reproduced is supplied to the attenuators 8TRL and 8TRR.

The R and L signals, which have been level-regulated by the attenuators 8TFR, are amplified by amplifiers 9AFR, 9ARR, and 9AFL and 9ARL by a predetermined amount. The R and L signals are reproduced by the speakers (SFR)5, (SRR)7, and (SFL)4, (SRL)6.

Figure 3:
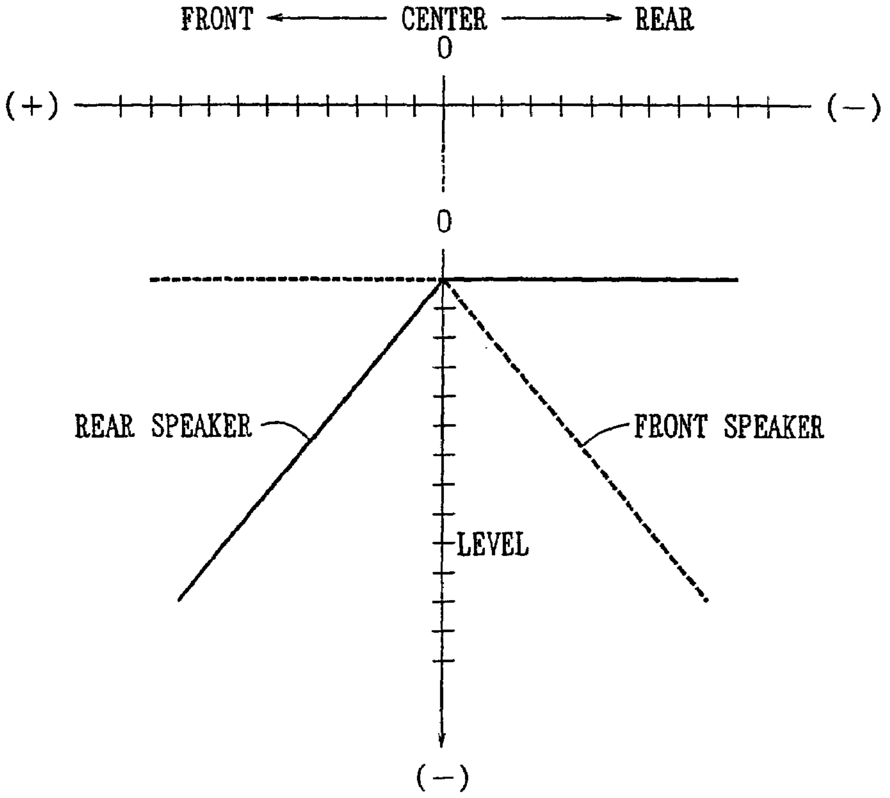
FIG. 3 is a view for explaining a conventional volume controller.

In FIG. 1, reference numeral 10 denotes a preset attenuation value recording unit for recording a preset attenuation value described later, 11 a loss recording unit; and 12 a fade volume computing unit for computing a signal amplifying factor (described later) on the basis of the preset value recorded on the preset attenuation value recording unit 10, an attenuated amount recorded on the loss recording unit 11 and a movement (“fade”) of a balancing point from the center to the front or rear side inputted from the fade input unit. Reference numeral 13 denotes an entire volume input unit for controlling the volume of the signals reproduced by the front left speaker (SFL)4, front right speaker (SFR)5, rear left speaker (SRL)6 and rear right speaker (SRR)7. Reference numeral 14 denotes an individual volume input unit for individually controlling the volume of the signal reproduced by each of the front left speaker (SFL)4, front right speaker (SFR)5, rear left speaker (SRL)6 and rear right speaker (SRR)7. Reference numeral 15 denotes the fade input unit for setting the above "fade" in the conventional volume controller as shown in FIG. 3. Reference numeral 16 denotes a control unit. Reference numeral 17 denotes an interface (110) for supplying various values to the attenuators 8TFL, 8TFR, 8TRL and 8TRR under the control by a processor (CPU) 18. Reference numeral 18 denotes the processor for executing the control processing for the preset value recording unit 10, loss recording unit 11, fade volume computing unit 12, entire volume input unit 13, individual volume input unit 14, fade input unit 15 and control unit 16.

Figure 2:
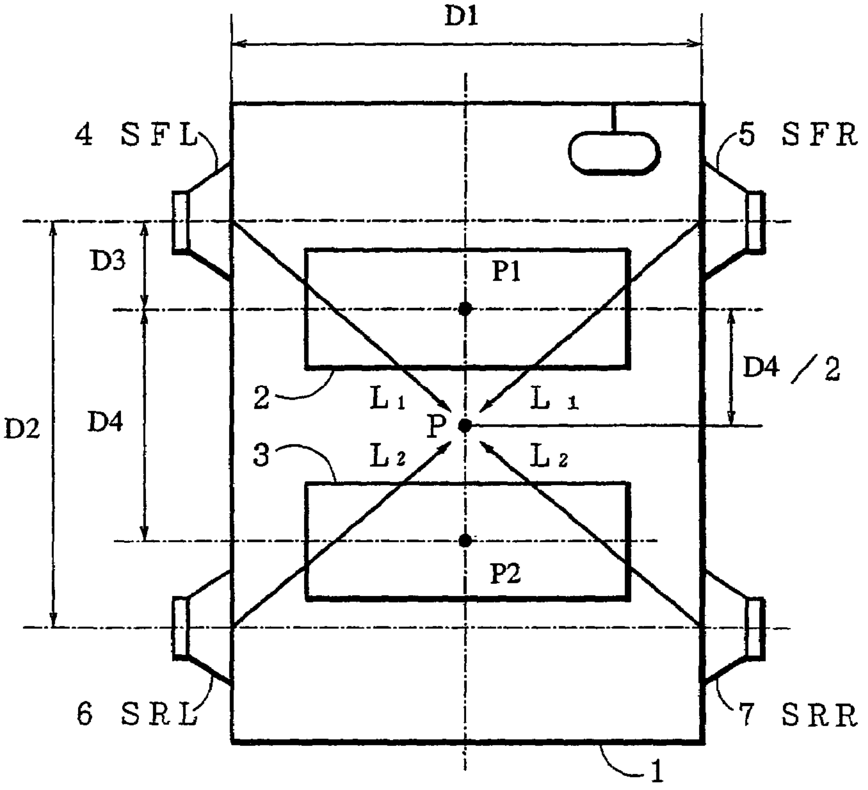
FIG. 2 is a view for explaining the operation of the embodiment.

As shown in FIG. 2, with a central point P between the the front seat 2 and the rear seat 3, the loss recording unit 11 previously records an attenuated amount $L_1$ of an acoustic wave produced from the front left speaker (SFL) 4 or the front right speaker (SFR) 5 while it reaches the central point P, and an attenuated amount $L_2$ of an acoustic wave produced from the rear left speaker (SRL) 6 or the rear right speaker (SRR) 7 while it reaches the central point P.

In recording, with attenuated amounts for distances which have been acquired experimentally being recorded, the loss recording unit 11 may compute the attenuated amounts L1 and L2 by inputting the distances to the central point P.

The distances to the central point P may be computed from the distance D1 between the left and right speakers, the distance D2 between the front and rear speakers, distance D3 between the front speakers and the front seat P1, and distance D4 between the front seat P1 and rear seat P2.

An explanation will be given of the operation of the volume controller according to this invention.

Now it is assumed that the volume produced from the speaker is proportional to the level of the signal supplied thereto.

Assuming that the R signal and L signal supplied to the volume controller according to this invention have equal signal levels and the amplifiers 9AFR, 9AFL, 9ARL and 9ARR connected to the speakers provide equal gains, the volume of the sound produced from the front left speaker (SFL) 4, front right speaker (SFR) 5, rear left speaker (SRL) 6 and rear right speaker (SRR) 7 is proportional to the attenuating amount in the attenuators 8TFL, 8TFR, 8TRL and 8TRR.

Assuming that the attenuations in the attenuators 8TFL, 8TFR, 8TRL and 8TRR are TFL, TFR, TRL and TRR, respectively, if an increment or decrement of a constant K is input from the entire volume unit 13, $$TFL=K$$
$$TFR=K$$
$$TRL=K$$
$$TRR=K \tag{1}$$

Therefore, the respective attenuators provide the increment or decrement of the same value K.

Where the individual volume input unit 14 performs the volume adjustment for each speaker input unit 14 to supply the attenuating amounts kFL, kFR, kRL and kRR to the attenuators 8TFL, 8TFR, 8TRL and 8TRR, $$TFL=K+k_{FL}$$
$$TFR=K+k_{FR}$$
$$TRL=K+k_{RL}$$
$$TRR=K+k_{RR} \tag{2}$$

The attenuations TFL, TFR, TRL and TRR are recorded in the preset value recording unit 10.

Assuming that the input from the fade input unit 15 is a "center" value (attenuating factor $K_F=1$), the entire volume P at the position P in FIG. 2 is represented by $$P=SV(TFL+TFR)L_1+SV(TRL+TRR)L_2 \tag{3}$$

where SV represents a product of an input signal (L signal, R signal) and the gain of the amplifier 9.

In the following explanation, the entire volume P in Equation (3) is normalized by SV, and the normalized value is represented by P. Namely, $$P=(TFL+TFR)L_1+(TRL+TRR)L_2 \tag{4}$$

If a movement of a balancing point from the center to the rear side (the signal for the front speaker is attenuated by the attenuating factor $K_F$ ($K_F>1.0$)) is inputted by the fade input unit 15, TFL and TFR are represented by $$TFL=KF(K+k_{FL})$$
$$TFR=KF(K+k_{FR}) \tag{5}$$

The volume $P_F$ from the front speakers at the point P is a sum of TFL and TFR in Equation (5). Namely, $$P_F=K_F\{(K+k_{FL})+(K+k_{FR})\}L_1 \tag{6}$$

In this invention, where the balancing point is moved to the rear side by the fade input unit, when the volume from the front speaker becomes $P_F$ expressed by Equation (6), the volume $P_R$ from the rear speaker is increased so that the volume at point P is equal to the volume before the balancing point moves.

Namely, $$P_F+P_R=P \tag{7}$$

Assuming that the signal amplification factor $k_R$ for the rear speaker $0.0 \leqq k_R \leqq 1.0$, $$\begin{aligned} P_R &= k_R(TRL+TRR)L_2 \\ &= k_R\{(K+k_{RL})+(K+k_{RR})\}L_2 \end{aligned} \tag{8}$$

Substituting Equations (4), (6) and (8) into Equation (7), $$K_F=\{(K+k_{FL})+(K+k_{FR})\}L_1+k_R\{(K+k_{RL})+(K+k_{RR})\}L_2=\{(K+k_{FL})+(K+k_{FR})\}L_1+\{(K+k_{RL})+(K+k_{RR})\}L_2 \tag{9}$$

Therefore, $k_R$ is acquired from Equation (9), $$k_R=1+(1-K_F)\{(K+k_{FL})+(K+k_{FR})L_1\}/\{(K+k_{RL})+(K+k_{RR})L_2\} \tag{10}$$

In Equation (10), $(K+k_{FL})$, $(K+k_{FR})$, $(K+k_{RL})$, and $(K+k_{RR})$, as explained in connection with Equation (2), have been recorded as TFL, TER, TRL and TRR in the preset value recording unit 10. $L_1$ and $L_2$ have been recorded in the loss recording unit 11. If the movement of a balancing point from the center to the rear side (the signal for the front speaker is attenuated by the attenuating factor $K_F$($K_F>1.0$) is supplied from the fade input unit 15, the fade volume computing unit 12 read the data from the preset value recording unit 10 and the loss recording unit 11 to execute the operation of Equation (10), thereby computing $k_R$.

The control unit 16 multiplies the attenuated amount in the attenuators 8TRL and 8TRR by $k_R$.

Upon completion of the operation of computing the fade volume, the control unit 16 records the $K_F$-times values of the attenuators 8TFL and 8TFR and the $k_R$-times values of the attenuators 8TRL and 8TRR in the preset value recording unit 10 to deal with a next fade input. The preset values are set at the recorded attenuations in the attenuator 8TFR, 8TFL, 8TRL and 8TRR.

On the other hand, if a movement of the balancing point from the center to the front side is supplied from the fade input unit 15 (the signal for the rear speaker is $K_R$ attenuated ($K_R$>1.0)), the attenuations in the attenuators 8TRL and 8TRR are multiplied by $K_R$.

Assuming that the signal amplification factor $k_F$ for the rear speaker ($k_F$=1.0–0.0), the fade volume computing unit 12 computes $k_F$ from the following Equation $$k_F=1+(1-K_R)\{(K+k_{RL})+(K+k_{RR})L_2/\{(K+k_{FL})+(K+k_{FR})L_1 \quad (11)$$

Upon completion of computing the fade volume, the $k_F$-times and $K_R$-times attenuations are recorded in the preset value recording unit 10 to deal with a next fade input. The preset values are set at the recorded attenuations in the attenuator 8TFR, 8TFL, 8TRL and 8TRR.

In the embodiment described above, although the center point P was located between the front seat 2 and the rear seat 3, as seen from FIG. 2, it may be a center point P1 of the front seat 2 or center point P2 of the rear seat 3. The center point may be exchanged among P, P1 and P2.

What is claimed is:

1. A volume controller for controlling volume balance between a front speaker and a rear speaker located within a vehicle, comprising:

a fade volume computing unit for computing an amplifying factor k1 of an input signal for providing an increased volume at the rear or front speaker by the volume at a prescribed position within the vehicle which is equal to a decreased volume at the front or rear speaker when an input signal is attenuated by an attenuating factor K1, so that when a balancing point is moved from the prescribed position, a total volume at the prescribed position is unchanged; and a control unit for multiplying the signal supplied to the rear or front speaker by the amplifying factor k1 when the input signal supplied to the front or rear speaker is attenuated by the attenuating factor K1 and configured to deal with a next fade input with attenuations changed by the amplifying factor k1 and the attenuating factor K1 recorded and newly set upon completion of the fade volume computing, wherein attenuations when acoustic waves from the front speaker and rear speaker are propagated to the prescribed position are previously recorded, and on the basis of the attenuations, the increased and decreased volumes at the front or rear speaker are computed.

2. A volume controller according to claim 1, wherein the prescribed position is located at a center of a front seat, at a center of a rear seat, or a center between the front seat and the rear seat.

3. A volume controller according to claim 1, wherein the attenuations are computed on the basis of an input indicative of a relationship between the prescribed position and positions where the front and rear speakers are located.

4. A volume controller according to claim 1, wherein the decreased volume at the front or rear speaker and the increased volume at the rear or front speaker are computed on an adjustment value in a level adjusting means to be connected to the front speaker and the rear speaker.

5. A volume controller, comprising:

an input circuit that receives a user input and that generates an adjustment command based on the user inputs; and a control circuit that, in response to the adjustment command, moves a balancing point of at least a first speaker and a second speaker relative to a predetermined position by adjusting a relative volume of at least the first speaker and the second speaker, wherein sound from at least the first speaker and the second speaker has a total volume at the predetermined position, and wherein the total volume at the predetermined position is unchanged when the balancing point is moved from the predetermined position.

6. The volume controller as claimed in claim 5, wherein the first speaker is a front speaker in a vehicle, wherein the second speaker is a rear speaker in the vehicle, and wherein the user input is a fade adjustment input.

7. The volume controller as claimed in claim 6, wherein the control circuit adjusts the relative volume by increasing the volume of the first speaker and decreasing the volume of the second speaker.

8. The volume controller as claimed in claim 6, wherein the control circuit adjusts the relative volume by decreasing the volume of the first speaker and increasing the volume of the second speaker.

9. The volume controller as claimed in claim 6, wherein the control circuit adjusts the relative volume based on a relationship between the predetermined position and positions where at least the first speaker and the second speaker are located.

10. The volume controller as claimed in claim 5, wherein the control circuit adjusts the relative volume by increasing the volume of the first speaker and decreasing the volume of the second speaker.

11. The volume controller as claimed in claim 5, wherein the control circuit adjusts the relative volume by decreasing the volume of the first speaker and increasing the volume of the second speaker.

12. The volume controller as claimed in claim 5, wherein the control circuit adjusts the relative volume by amplifying an input signal to one speaker of the first speaker and the second speaker based on an amplification factor and attenuating an input signal to another speaker of the first speaker and the second speaker based on an attenuation factor, wherein amplifying the input signal to the one speaker increases the volume of the one speaker and attenuating the input signal to the other speaker decreases the volume of the other speaker.

13. A volume controller, comprising:

an input circuit that receives a user input and that generates an adjustment command based on the user inputs; and a control circuit that, in response to the adjustment command, moves a balancing point of a plurality of speakers by adjusting a relative volume of the plurality of speakers, wherein sound from plurality of speakers has a total volume at the predetermined position, and wherein the total volume at the predetermined position remains unchanged when the balancing point moves from the predetermined position.

14. The volume controller according to claim 13, wherein the predetermined position is located at a center of a front seat of a vehicle, at a center of a rear seat of the vehicle, or a center between the front seat and the rear seat.

15. The volume controller as claimed in claim 13, wherein the control circuit adjusts the relative volume based on a relationship between the predetermined position and positions where the plurality of speakers are located.

16. The volume controller as claimed in claim 13, wherein the user input is a fade adjustment input.

17. The volume controller as claimed in claim 13, wherein the plurality of speakers comprise:

a front set of speakers in a front portion of a vehicle; and a rear set of speakers in a rear portion of the vehicle.

18. The volume controller as claimed in claim 17, wherein, in response to the fade adjustment input, the control circuit moves the balancing point by adjusting a relative volume between the front set of speakers and the rear set of speakers.

* * * * *